(12) United States Patent
Mawby et al.

(10) Patent No.: US 8,260,583 B2
(45) Date of Patent: Sep. 4, 2012

(54) SYSTEM AND METHOD FOR IDENTIFYING WALL FACES IN AN OBJECT MODEL

(75) Inventors: Eric Mawby, Windham, NH (US); Victor Hambridge, Cypress, CA (US)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 362 days.

(21) Appl. No.: 12/558,083

(22) Filed: Sep. 11, 2009

(65) Prior Publication Data
US 2010/0232701 A1    Sep. 16, 2010

Related U.S. Application Data

(60) Provisional application No. 61/159,595, filed on Mar. 12, 2009.

(51) Int. Cl.
| G06F 17/50 | (2006.01) |
| G06F 7/60 | (2006.01) |
| G06G 7/48 | (2006.01) |
| G06T 15/00 | (2011.01) |
| G06F 17/00 | (2006.01) |
| G06T 17/00 | (2006.01) |
| G06F 7/00 | (2006.01) |

(52) U.S. Cl. ......... 703/1; 703/2; 703/6; 703/7; 345/419; 345/420; 707/703; 707/706; 707/722; 707/769; 707/803

(58) Field of Classification Search .......... 703/1, 2, 703/6, 7; 345/419, 420; 707/703, 706, 722, 707/769, 803
See application file for complete search history.

(56) References Cited

U.S. PATENT DOCUMENTS

| 126,307 | A | * | 4/1872 | Jones | 409/326 |
| 5,442,572 | A | * | 8/1995 | Kiridena et al. | 382/141 |
| 5,493,679 | A | * | 2/1996 | Virgil et al. | 1/1 |
| 5,506,785 | A | | 4/1996 | Blank et al. | |
| 5,734,383 | A | * | 3/1998 | Akimichi | 345/420 |
| 6,229,545 | B1 | | 5/2001 | Satoh | |
| 6,246,412 | B1 | * | 6/2001 | Shum et al. | 345/419 |
| 6,330,523 | B1 | * | 12/2001 | Kacyra et al. | 702/159 |
| 6,337,685 | B2 | * | 1/2002 | Nagakura | 345/419 |
| 6,473,079 | B1 | * | 10/2002 | Kacyra et al. | 345/419 |
| 6,516,277 | B2 | * | 2/2003 | Edgecombe et al. | 702/27 |
| 6,625,607 | B1 | * | 9/2003 | Gear et al. | 1/1 |
| 6,629,093 | B1 | * | 9/2003 | Davis et al. | 707/722 |
| 6,721,684 | B1 | * | 4/2004 | Saebi | 702/183 |

(Continued)

OTHER PUBLICATIONS

Dick et al. "Modelling and Interpretation of Architecture from Several Images", International Journal of Computer Vision 60(2), 111-134, 2004.*

(Continued)

*Primary Examiner* — Shambhavi Patel

(57) ABSTRACT

A method, system, and computer readable medium for identifying wall features in an object model represented in a CAD system. A method includes loading an object model in a CAD system and receiving a selection of a first face of the object model by the CAD system. The method includes finding candidate wall faces by the CAD system and storing the candidate wall faces in a candidate list, and designating at least one candidate wall face in the candidate list as a counterpart face to the first face. The method includes storing the first face and the counterpart faces as a wall of the object model. Some methods include removing at least one second face from the candidate list based on an exclusion rule.

20 Claims, 3 Drawing Sheets

U.S. PATENT DOCUMENTS

| | | | |
|---|---|---|---|
| 6,734,849 B2 * | 5/2004 | Dimsdale et al. | 345/419 |
| 6,757,643 B2 * | 6/2004 | Gavin et al. | 703/1 |
| 6,847,462 B1 * | 1/2005 | Kacyra et al. | 356/601 |
| 6,850,946 B1 * | 2/2005 | Rappaport et al. | 707/796 |
| 6,912,293 B1 * | 6/2005 | Korobkin | 382/100 |
| 6,982,710 B2 * | 1/2006 | Salomie | 345/420 |
| 7,106,330 B2 * | 9/2006 | Liu et al. | 345/440 |
| 7,184,036 B2 * | 2/2007 | Dimsdale et al. | 345/419 |
| 7,277,835 B2 | 10/2007 | Spitz et al. | |
| 7,295,958 B1 * | 11/2007 | Suh et al. | 703/7 |
| 7,363,197 B2 * | 4/2008 | Onodera et al. | 703/1 |
| 7,583,272 B2 * | 9/2009 | Ramani et al. | 345/621 |
| 7,693,692 B2 * | 4/2010 | Fujinuma | 703/2 |
| 7,778,995 B2 * | 8/2010 | Qamhiyah et al. | 707/706 |
| 8,126,907 B2 * | 2/2012 | Knighton et al. | 707/769 |
| 2003/0001835 A1 * | 1/2003 | Dimsdale et al. | 345/419 |
| 2003/0052875 A1 * | 3/2003 | Salomie | 345/419 |
| 2004/0249809 A1 * | 12/2004 | Ramani et al. | 707/4 |
| 2005/0073519 A1 * | 4/2005 | Onodera et al. | 345/420 |
| 2005/0168460 A1 * | 8/2005 | Razdan et al. | 345/419 |
| 2007/0027665 A1 * | 2/2007 | Maille et al. | 703/6 |
| 2008/0126307 A1 | 5/2008 | Lin et al. | |
| 2008/0143712 A1 | 6/2008 | McBagonluri et al. | |
| 2009/0271156 A1 * | 10/2009 | Kageura | 703/1 |
| 2010/0013833 A1 * | 1/2010 | Gandikota et al. | 345/420 |
| 2010/0092093 A1 * | 4/2010 | Akatsuka et al. | 382/203 |

OTHER PUBLICATIONS

Berndt et al. "Generative 3D Models: A Key to More Information within Less Bandwidth at Higher Quality", ACM 2005.*

Cantzler, Helmut. "Improving architectural 3D reconstruction by constrained modelling", 2003.*

Cardone et al. "A Survey of Shape Similarity Assessment Algorithms for Product Design and Manufacturing Applications", Journal of Computing and Information Science in Engineering Jun. 2003, vol. 3.*

Finkenzeller et al. "Feature-based decomposition of façades", Proceedings of Virtual Concept 2005.*

Iyer et al. "Three-dimensional shape searching: State-of-the-art review and future trends", Computer-Aided Design 37 (2005) 509-530.*

Jayanti et al. "Developing an engineering shape benchmark for CAD models", Computer-Aided Design 38 (2006) 939-953.*

Larive et al. "Wall Grammar for Building Generation", 2006.*

Lockett et al. "Graph-Based Feature Recognition for Injection Moulding based on a Mid-Surface Approach", Computer-Aided Design, vol. 37, Issue 2, Feb. 2005.*

McWherter et al. "Transformation Invariant Shape Similarity Comparison of Solid Models", 2001.*

So et al. "Reconstruction of 3D Virtual Buildings from 2D Architectural Floor Plans", ACM 1998.*

Thiemann et al. "Interpretation of Building Parts from Boundary Representation", EuroSDR 2005.*

Quadros et al. "An approach for extracting non-manifold mid-surfaces of thin-wall solids using chordal axis transform", Engineering with Computers (2008) 24:305-319.*

Schindler et al. "Detailed Building Reconstruction With Shape Templates", 2003.*

Spinelli et al. "Recovering 3D architectural information from dense digital models of buildings", Computer Graphics Forum (Dec. 2005).*

Suter et al. "Building model reconstruction based on sensed object location information", Automation in Construction 16 (2007) 2-12.*

Tangelder et al. "A survey of content based 3D shape retrieval methods", Multimed Tools Appl (2008) 39:441-471.*

Tate, Susan. "Symmetry and Shape Analysis for Assembly-Oriented CAD", 2000.* van Treek et al. "Analysis of Building Structure and Topology Based on Graph Theory", 2004.*

Wessel et al., "Analysis of Building Structure and Topology Based on Graph Theory", 2007.*

Arivazhagan, et al. Published in the International Journal of Advanced Manufacturing Technology, Springer, vol. 39, No. 3-4, Nov. 17, 2007 (pp. 319-332); Magazine.

He, et al. Published in Computer-Aided Design and Computer Graphics, 11th IEEE International Conference, Aug. 19, 2009 (pp. 367-370); Magazine.

Mohsen Rezayat, Published in Computer-Aided Design, vol. 28, No. 11, 1996 (pp. 905-915); Magazine.

* cited by examiner

SYSTEM AND METHOD FOR IDENTIFYING WALL FACES IN AN OBJECT MODEL

CROSS-REFERENCE TO OTHER APPLICATION

This application claims priority from U.S. Provisional Patent Application 61/159,595, filed Mar. 12, 2009, which is hereby incorporated by reference.

TECHNICAL FIELD

The present disclosure is directed, in general, to computer aided design, drafting, manufacturing, and visualization systems (individually and collectively, "CAD systems").

BACKGROUND OF THE DISCLOSURE

Three-dimensional object models in CAD systems can include opposing faces or sets of faces that together comprise a wall.

SUMMARY OF THE DISCLOSURE

Various disclosed embodiments include a method, system, and computer readable medium for identifying wall features in an object model represented in a CAD system. A method includes loading an object model in a CAD system and receiving a selection of a first face of the object model by the CAD system. The method includes finding candidate wall faces by the CAD system and storing the candidate wall faces in a candidate list, and designating at least one candidate wall face in the candidate list as a counterpart face to the first face. The method includes storing the first face and the counterpart faces as a wall of the object model. Some embodiments include removing at least one second face from the candidate list based on an exclusion rule.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

Figure 1:
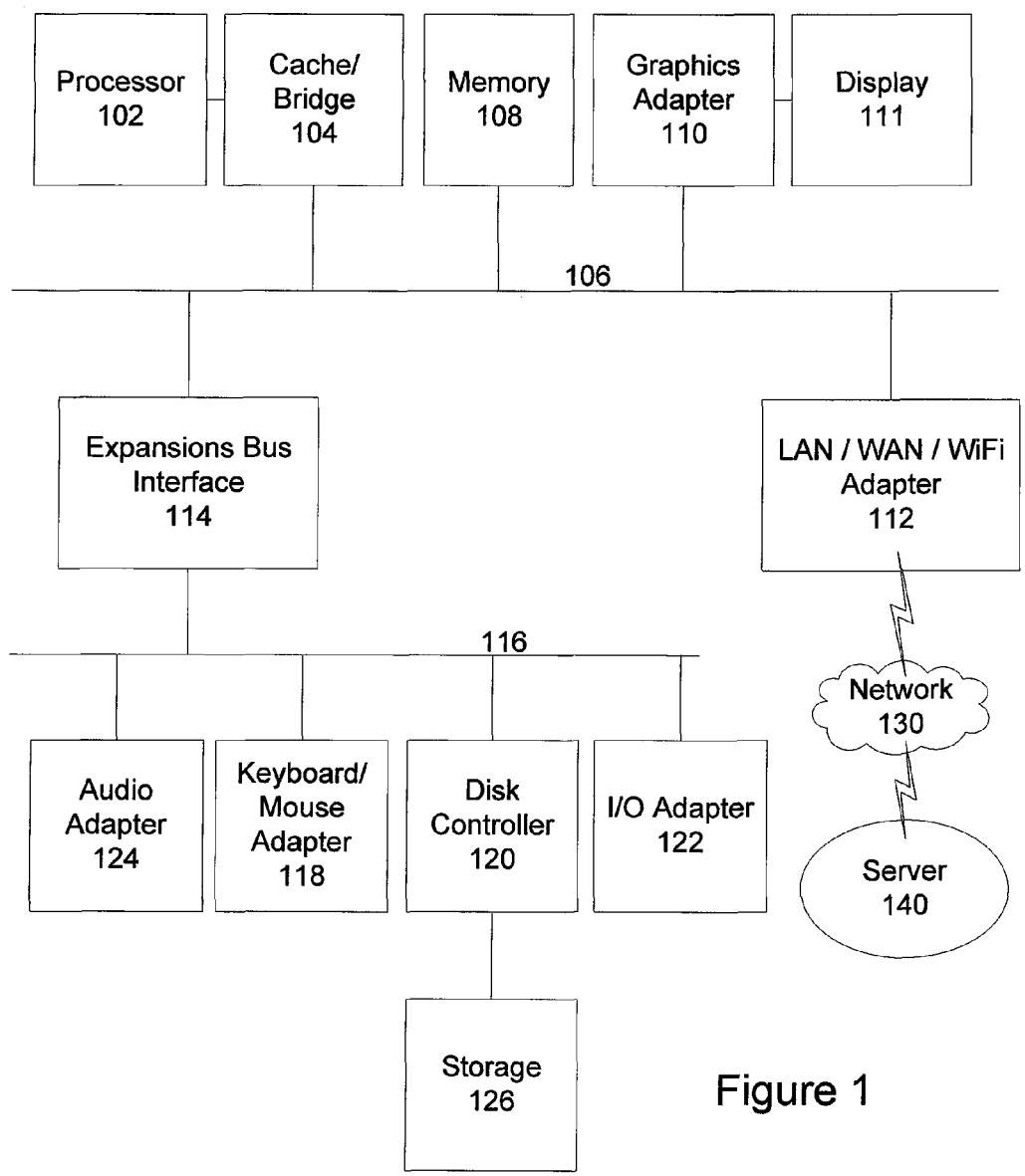
FIG. 1 depicts a block diagram of a data processing system in which an embodiment can be implemented, for example as a CAD system according to disclosed embodiments.
Figure 2A:
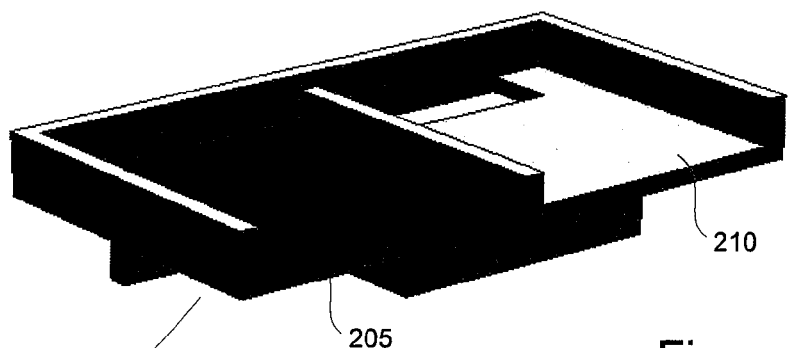
FIGS. 2A and 2B illustrate multiple faces of an object model that together comprise a wall in accordance with disclosed embodiments.
Figure 2B:
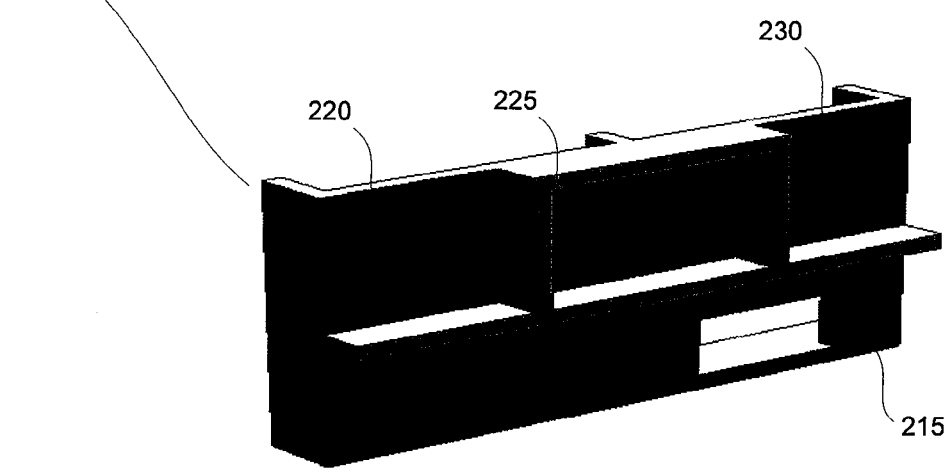
Figure 3:
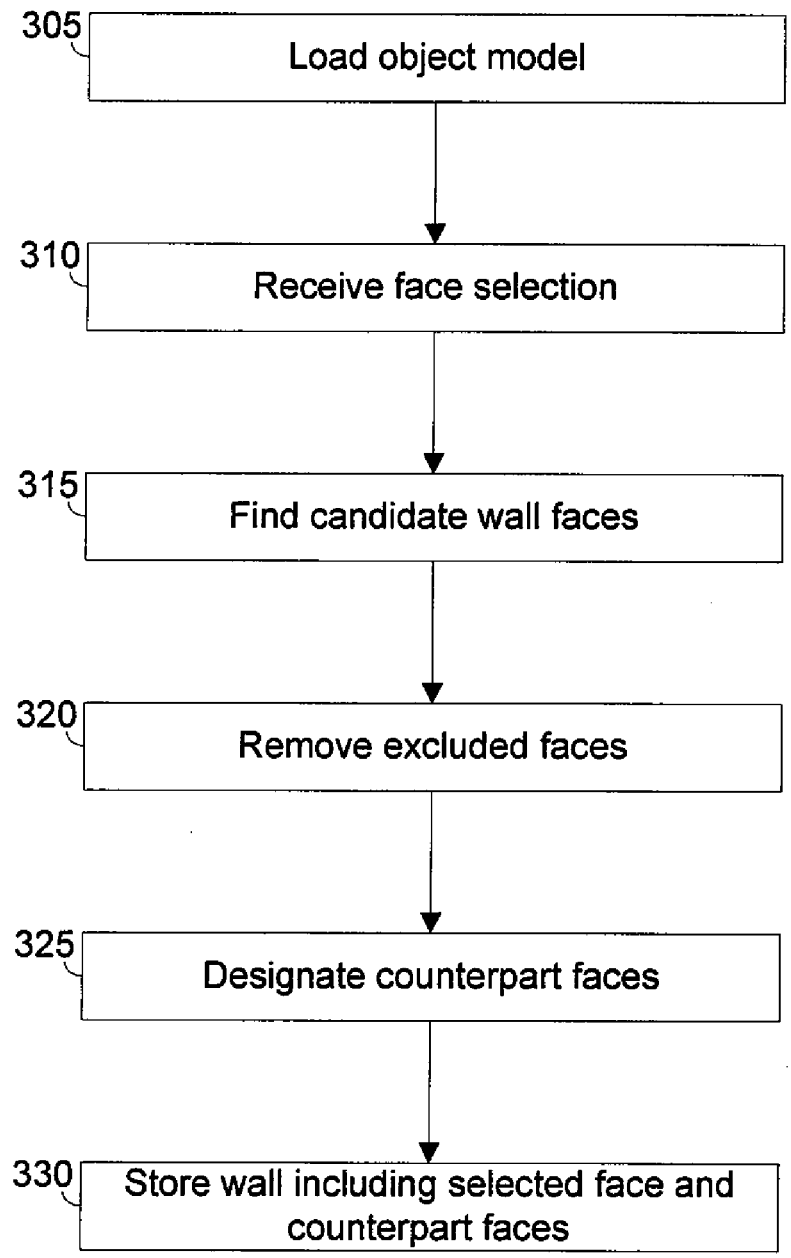
FIG. 3 depicts a flowchart of a process in accordance with disclosed embodiments.

FIGS. 1 through 3, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

CAD systems model two-dimensional and three-dimensional object models. One method for representing these shapes is boundary representation (also b-rep or BREP) that represents shapes using the limits. A solid is represented as a collection of connected surface elements, the boundary between solid and non-solid. Boundary representation is essentially understood as a local representation connecting faces, edges and vertices. An extension of this was to group sub-elements of the shape into logical units called geometric features, or simply features.

Disclosed embodiments include a system and method for searching a multitude of faces within an object model, including a b-rep model, to find counterpart faces that compose a wall in a characteristic thin-wall shell model. In some embodiments, the system discriminates and matches faces by evaluating criteria of geometric condition, spatial proximity, and topological proximity. The faces that compose the wall, as determined by the system, can then be stored, displayed, and/or transmitted to any number of commands or applications interested in operating on the wall.

In some embodiments, the system finds a wall at an atomic level, on demand, when it is necessary to identify or edit a wall. Another technique known as "feature recognition" adds intelligence to an imported model by converting the b-rep model to a feature model. Most feature recognition solution is interpret a b-rep model as a collection of volumetric shapes and reproducing a constructive solid geometry (CSG) model of features that replicate the shapes in the receiving system. Feature recognition techniques fail on many parts, including in particular object models of complex molded plastic thin-wall parts, used in many manufactured products.

FIG. 1 depicts a block diagram of a data processing system in which an embodiment can be implemented, for example as a CAD system as described herein. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, etc.

Those of ordinary skill in the art will appreciate that the hardware depicted in FIG. 1 may vary for particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

As described herein, a model imported from a foreign source arrives with little or no intelligence, such as no features and no record of how the model was constructed. The model typically lacks the inherent data instilled in features by the authoring system to support edit of the model.

In the area of synchronous modeling, and in other areas, editing an imported model that contains characteristic hollow, thin-wall volumes, that the industry has long referred to as "a shell", can be difficult. Synchronous modeling aims to perform in a source-independent manner, working equally well, or as close to equal as possible, on models both foreign and domestic. Current systems are unable to effectively edit imported models, or to edit a part that is converted from history to history-free, since what was a shell feature in history is no longer a feature in history-free.

For example, editing a shell model necessitates maintenance of wall thickness. When a face of a wall is edited, the counterpart face or faces on the opposite side of the wall need to be addressed to maintain wall thickness. In the event that a wall face is moved the counterpart face or faces need also be selected to move in the same operation, or moved as a separate operation.

The disclosed embodiments include an improved approach to editing thin-wall shell parts. The disclosed systems and methods perform "shell recognition" in a manner entirely different from traditional feature recognition. The disclosed approach does not rely on decomposition of the b-rep model to determine when a shell feature might have been applied to the body.

The disclosed embodiments provide many advantages and capabilities, among them the ability for the system to find a discrete wall interactively and to find walls en masse. A simple example of finding a discrete wall is the need to move a wall. Selecting a face will find counterpart faces that compose a wall so that the wall is maintained during the move.

The disclosed find wall techniques are particularly useful for adding synchronous shell behavior to an imported model. This can involve finding walls en masse and assigning synchronous shell relations to found walls. The synchronous shell behavior is embodied in the shell relation and adding shell relations manually, without the disclosed techniques, would be time consuming and monotonous at best.

Disclosed embodiments include several inter-related aspects and technologies. Various embodiments can search a multitude of faces within a b-rep model to find counterpart faces that compose a wall in a characteristic thin-wall shell model. Faces are discriminated and matched by evaluating criteria including geometric condition, spatial proximity, and topological proximity, eventually resulting in a counterpart match.

The find wall techniques disclosed herein can be also employed independently of an interactive CAD session. For example, within a batch process, the system can find a multitude of walls within a network of many faces of a b-rep model, sort the multitude of walls into groups of common thickness, and assign a wall thickness to each group.

FIGS. 2A and 2B illustrate multiple faces of an object model 200 that together comprise a wall. FIG. 2A shows object model 200 from a first perspective; FIG. 2B shows the same object model 200 from a second perspective. Object model 200 is not a clinical "wall" as would be produced by a shell command but it certainly is a wall in the human view. Absent the ribs that divide the various faces, it would be a characteristic shell model, but real models are typically more complex.

In this example, coplanar exterior faces 205 and 210 are on one side of the wall, and exterior faces 215, 220, 225, and 230 are on the opposite side of the wall. The other features, such as various dividers, are found on either side of the "wall" model object, but don't form part of the wall as commonly understood.

Using this example, various tests can be used to find wall faces. For example, using a "coplanar" test, if face 205 is selected, the system can determine that face 210 is coplanar. If face 220 is selected, the system can determine that faces 225, 230, and 215 are coplanar. Using an "offset" test, if face 205 is selected, the system can determine that faces 220, 225, and 214 are offset and coplanar to face 205 (i.e., they are offset parallel faces). Using a combination of coplanar and offset tests, the system can also then determine that face 210 is coplanar to face 205, and face 230 is an additional face that is offset and coplanar to face 205. The coplanar condition face 210 and offset propagation from face 215 finds face 230. Together, these faces form a wall that a user may wish to move or otherwise edit as a whole.

To emulate the human view of a wall the system discriminates based on several objective conditions of model geometry to find counterpart faces. In various embodiments, one or more of the geometric conditions (GCs) outlined below can be evaluated.

GC1: Counterparts are from the same body.
GC2: Counterparts are the same surface type.
GC3: Counterparts have opposing surface-normal vectors.
GC4: Counterparts are offset.
  Plane: Planes are parallel.
  Cylinder: Cylinders are coaxial.
  Cone: Cones are coaxial and have the same angle.
  Torus: Tori are coaxial and concentric.
  Sphere: Spheri are concentric.
  BSurf: BSurfs are offset.

As used herein, "coaxial" means the faces share the same axis. "Concentric" means the faces share the same center point. "Bsurf" refers to a set of shell element faces that define a contact surface.

In various embodiments, one or more of the spatial proximity (SPs) factors outlined below can be evaluated. These can be exclusion rules.

SP1: Counterpart ranges overlap—common range.
SP2: Counterparts are relatively close compared to the range of the body—close range.

In various embodiments, one or more of topological proximity (TPs) outlined below can be evaluated. This can also be an exclusion rule.

TP1: Counterparts have a common neighbor face.

Common neighbor distinguishes a percentage of cases but not all cases.

FIG. 3 depicts a flowchart of a process in accordance with disclosed embodiments. As those of skill in the art will recognize, in the various processes describes herein, certain steps can be performed in different order, serially, or concurrently. Various steps will be described here, and then further in more detail below.

Here, the CAD system first loads an object model (step 305). This step can include loading from a storage, or receiving the model from another system or network, or otherwise.

The system receives the selection of a first face of an object model (step 310). Note that, in various embodiments, this can be the result of receiving a user input, or can be a selection indicated by the same or another CAD process, or otherwise. Similarly, as described herein, this selection can be a parallel or serial selection on several faces for batch processing to determine a number of object model walls. Note that in various embodiments, steps 305 and 310 can in particular be performed in reverse order or concurrently.

The system finds one or more candidate wall faces corresponding to the first face and stores them in a candidate list (step 315). Given the selection of the first face, the system finds candidate faces that satisfy geometric conditions GC1-GC4 as defined above. Each of the GC1-GC4 conditions, in some embodiments, can be evaluated from data in a geometry index. GC2 (same surface type) is a geometric scope criterion, and GC3 (opposing normals) is a recognition property. These conditions can generally determine which exterior faces are coplanar with and parallel to the first face (i.e., the same side of the wall), coplanar with and offset from the first face (i.e., the opposite side of the wall), or coplanar with and offset from another face that is itself coplanar with and parallel to the first face (i.e., the opposite side of the wall from another face that is on the same side of the wall as the selected face). The candidate faces may include some faces that meet these initial criteria, but should be excluded from being considered part of the wall.

With regard to BSurf, note that no geometric conditions such as parallel or coaxial apply to BSurfs. To find an offset of a BSurf, the system performs a brute-force evaluation involving a sampling of points within the respective surfaces.

The system determines whether to exclude one or more candidate wall faces corresponding to the first face (step 320), and if so, removes the excluded faces from the candidate list. Note that in some cases, there will be no excluded faces. The list of candidate faces is potentially large so candidates need to be excluded based on additional conditions. Given input of a candidate list, in some embodiments the system first excludes candidate faces based on SP1 and then excludes candidate faces based on SP2.

The system designates counterpart faces according to the first face, the first face and counterpart faces together defining a wall of the object model (step 325). The list of candidates potentially contains more than the ideal candidate. The TP and GC conditions described above can aid in choosing the ideal candidate from among several possibilities.

This step may include, given the input of a candidate list (not including those faces excluded above), sorting the candidate list based on an offset distance from the first face (CC1). In this case, the system sorts the list of candidate faces by their offset distance from the target face. In some cases, this does not absolutely identify the ideal candidate but it provides a useful hint in that the closest candidate is likely to be the ideal candidate. The faces with smallest distance will be referred to herein as CC1top. There can be multiple counterpart faces.

The system stores and/or displays the counterpart faces as forming a wall with the first face (step 330). Displaying the wall can include, for example, showing the counterpart faces in a different color on a display in order to distinguish the wall faces from the remainder of the display, and other techniques known to those of skill in the art.

It will be understood by those of skill in the art that, in some embodiments, the process described above is fully automated and immediate to a user. For example, if a user of a CAD system has selected a "find wall" feature with regard to a loaded object model, the user can simply select one of the faces, and the system will perform a process as described above, automatically determining candidate faces according to the various geometric conditions, possibly excluding some of the candidates based on other conditions, determining the appropriate counterpart faces that form the wall with the selected face, and displaying, highlighting, and selecting all the appropriate faces that comprise the wall. These faces, as a wall, can then be manipulated or edited either as a unit or individually, according to the user's preference. The system can also allow the user to select additional faces or deselect automatically-determined faces as part of the wall as the user prefers.

Common Range—This is the SP1 condition of spatial proximity. For a plane, the system projects the range of the candidate against the range of the target along the target normal. If the ranges do not overlap, then the system excludes the candidate. This will exclude, for example, a candidate that is distant laterally from the target face.

If common range (SP1) is evaluated for the face 205, face 230 will be excluded. Propagation of offset from the coplanar face 210 will then find the face 230. In the end the human view of the wall is found but the SP1 discrimination is useful for cases more complex than this.

For other analytics, such as Cylinder, Cone, Torus, Sphere, the system intersects the 3D range of the candidate with the range of the target. If the ranges do not intersect, the system excludes the candidate.

Close Range is the SP2 condition of spatial proximity. For a plane, from the plane of the first face, the system produces a slice of 3D space, normal to the plane in both directions, whose depth is a fraction of the range of the body in the normal direction. If a candidate face is not within this slice, the system excludes it. This excludes a candidate at a distant end of the part. The initial slice fraction, in some embodiments, is 0.2 of the range, and this value can be changed in various implementations.

In some embodiments, this condition iterates. If this condition excludes all candidates, the system can change the range, such as doubling the range, and re-evaluate the condition. In some cases, prior to evaluating this condition, the system determines if there is only one candidate face; if so, then this condition does not need to be evaluated.

In other embodiments, this condition is reordered. For example, it can be evaluated during the find candidates process at step 315 rather than the exclude candidates process at step 320. If evaluated during find candidates, this condition limits the number of candidates initially found. For other analytics, such as for Cylinder, Cone, Torus, and Sphere, SP2 does not have the same meaning as it does for planes and is not evaluated.

Common Neighbor is the TP1 condition of topological proximity. The system evaluates the target face against each candidate to see if they share a common neighbor face. Not all walls have a common neighbor face, but some number of them do have a common neighbor face. This does not absolutely identify the ideal candidate but a candidate with a common neighbor is a likely candidate.

In some embodiments, various steps or sets of steps can be repeated to consider each appropriate in-line face, and each of their opposing coplanar faces. Various embodiments disclosed herein provide a clear technical advantage over current systems. Disclosed embodiments are able to effectively edit imported models, and to edit a part that are or have been converted from history to history-free, since the processes disclosed herein allow the system to find the relevant wall features.

Some embodiments include a step of adding synchronous shell behavior to an imported model. This can include finding walls as described herein, and assigning synchronous shell relations to found walls. The synchronous shell behavior is embodied in the shell relations, as understood by those of skill in the art. Various embodiments include a step of converting an imported model from history to history-free.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of a instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A method for identifying wall features in an object model represented in a CAD system, comprising:
   loading an object model in a CAD system;
   receiving a selection of a first face of the object model by the CAD system;
   finding candidate wall faces by the CAD system and storing the candidate wall faces in a candidate list;
   designating at least one candidate wall face in the candidate list as a counterpart face to the first face based on at least one of geometric conditions, spatial proximity, or topological proximity; and
   storing the first face and the counterpart faces in the CAD system as a wall of the object model.

2. The method of claim 1, wherein finding candidate wall faces includes determining if the first face is from a same object model body as a second face.

3. The method of claim 1, wherein finding candidate wall faces includes determining if the first face is of a same surface type as a second face.

4. The method of claim 1, wherein finding candidate wall faces includes determining if the first face has opposing normal vectors as a second face.

5. The method of claim 1, wherein finding candidate wall faces includes determining if the first face is offset from a second face.

6. The method of claim 1, further comprising removing at least one second face from the candidate list based on an exclusion rule.

7. The method of claim 6, wherein the exclusion rule includes determining if the first face and the second face have a common range.

8. The method of claim 6, wherein the exclusion rule includes determining the distance between the first face and the second face.

9. The method of claim 6, wherein the exclusion rule includes determining if the first face and the second face have a common neighbor face.

10. A CAD system comprising a processor and accessible memory, the CAD system particularly configured to perform the steps of:
    loading an object model;
    receiving a selection of a first face of the object model;
    finding candidate wall faces and storing the candidate wall faces in a candidate list;
    designating at least one candidate wall face in the candidate list as a counterpart face to the first face based on at least one of geometric conditions, spatial proximity, or topological proximity; and
    storing the first face and the counterpart faces as a wall of the object model.

11. The CAD system of claim 10, wherein finding candidate wall faces includes determining if the first face is from a same object model body as a second face.

12. The CAD system of claim 10, wherein finding candidate wall faces includes determining if the first face is of a same surface type as a second face.

13. The CAD system of claim 10, wherein finding candidate wall faces includes determining if the first face has opposing normal vectors as a second face.

14. The CAD system of claim 10, wherein finding candidate wall faces includes determining if the first face is offset from a second face.

15. The CAD system of claim 10, the CAD system further configured to perform the step of removing at least one second face from the candidate list based on an exclusion rule.

16. The CAD system of claim 15, wherein the exclusion rule includes determining if the first face and the second face have a common range.

17. The CAD system of claim 15, wherein the exclusion rule includes determining the distance between the first face and the second face.

18. The CAD system of claim 15, wherein the exclusion rule includes determining if the first face and the second face have a common neighbor face.

19. A tangible machine-readable medium encoded with computer-executable instructions that, when executed, cause a CAD system to perform the steps of:
    loading an object model;
    receiving a selection of a first face of the object model;
    finding candidate wall faces and storing the candidate wall faces in a candidate list;
    designating at least one candidate wall face in the candidate list as a counterpart face to the first face based on at least one of geometric conditions, spatial proximity, or topological proximity; and
    storing the first face and the counterpart faces as a wall of the object model.

20. The machine-readable medium of claim 19, further encoded with instructions that when executed cause the CAD system to perform the step of removing at least one second face from the candidate wall face based on an exclusion rule.

* * * * *